United States Patent
Yu

(10) Patent No.: US 9,905,812 B2
(45) Date of Patent: Feb. 27, 2018

(54) MASK PLATE AND ITS MANUFACTURING METHOD, AND OLED DEVICE PACKAGING METHOD

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 14/773,351

(22) PCT Filed: Jul. 23, 2015

(86) PCT No.: PCT/CN2015/084869
§ 371 (c)(1),
(2) Date: Sep. 6, 2015

(87) PCT Pub. No.: WO2017/000332
PCT Pub. Date: Jan. 5, 2017

(65) Prior Publication Data
US 2017/0141356 A1 May 18, 2017

(30) Foreign Application Priority Data
Jul. 1, 2015 (CN) .......................... 2015 1 0381253

(51) Int. Cl.
*H01L 51/56* (2006.01)
*H01L 51/52* (2006.01)
*C23F 1/02* (2006.01)

(52) U.S. Cl.
CPC .............. *H01L 51/56* (2013.01); *C23F 1/02* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2011/0157575 A1* | 6/2011 | Lee ....................... | C23C 14/042 355/72 |
| 2011/0198620 A1* | 8/2011 | Han ....................... | H05B 33/04 257/88 |
| 2015/0017759 A1* | 1/2015 | Hirobe ................... | C23C 14/24 438/99 |
| 2015/0068455 A1* | 3/2015 | Lee ....................... | B05C 21/005 118/504 |

(Continued)

FOREIGN PATENT DOCUMENTS

CN 101435960 A 5/2009

*Primary Examiner* — Angel Roman
(74) *Attorney, Agent, or Firm* — Andrew C. Cheng

(57) ABSTRACT

The disclosure is related to a mask plate and its manufacturing method, and OLED device packaging method. The mask plate comprises a hollow region; a non-hollow region arranged around the hollow region; and a semi-hollow region in a strip form arranged in the hollow region, having a head portion and a tail portion respectively connecting with the non-hollow region. By way of the above manner, the disclosure may enhance the bending performance of the flexible OLED device package.

15 Claims, 5 Drawing Sheets

(56) References Cited

U.S. PATENT DOCUMENTS

2016/0047030 A1\* 2/2016 Obata ................ H01L 51/0011
                                                  438/99
2016/0168691 A1\* 6/2016 Takeda ................ H01L 27/3211
                                                  118/504
2017/0012237 A1    1/2017 Sun \* cited by examiner

MASK PLATE AND ITS MANUFACTURING METHOD, AND OLED DEVICE PACKAGING METHOD

BACKGROUND

Technical Field

The disclosure is related to organic light emitting display field, and more particular to a mask plate and its manufacturing method, and OLED device packaging method.

Related Art

The organic light-emitting diode, also known as organic electroluminescent display (Organic Light-Emitting Diode, OLED), is a new generation of monitors. The organic film is made on the OLED substrate. The organic film is enclosed between the cathode and the anode metal. The organic film illuminates when the two electrodes are applied with a voltage. OLED displays have many advantages, including flexible display. The flexible OLED panel may be achieved by using a flexible plastic substrate as a carrier together with the thin film packaging process.

Currently OLED thin film package mainly adopts the laminated structure comprising a passivation layer and a buffer layer. The passivation layer usually adopts inorganic material such as SiNx, while the buffer layer usually adopts organic or partial organic material.

Because the thickness of the entire thin film package is micron level, and the stress of the inorganic film is larger when it is thicker, the fracture easily occurs when it is bent.

OLED devices will be aged by water and oxygen through the fracture such that the resistance to bending performance of the flexible OLED device package deteriorates.

SUMMARY

The technical problem mainly solved by the disclosure is to provide a mask plate and a manufacture method, and an OLED package method to enhance the bending performance of the flexible OLED device package.

In order to solve the above problem, one technical solution adopted by the disclosure is to provide a mask plate. The mask plate comprises a hollow region, a non-hollow region arranged around the hollow region, and a semi-hollow region in a strip form arranged in the hollow region, having a head portion and a tail portion respectively connecting with the non-hollow region.

In one embodiment, the mask plate comprises a plurality of the semi-hollow regions in a strip form crisscross arranged in the hollow region, and the head portion and the tail portion of each of the semi-hollow regions respectively connect with the non-hollow region.

In one embodiment, the semi-hollow region comprises a plurality of through holes arranged uniformly.

In one embodiment, the through holes are formed by laser cutting, photolithography, or etching process.

In one embodiment, the mask plate is made of a metal material or metal oxide material.

In order to solve the above problem, another technical solution adopted by the disclosure is to provide a method for manufacturing a mask plate. The method comprises providing a substrate; forming at least a hollow region on the substrate; and forming a semi-hollow region on the framework of the hollow region.

In one embodiment, the step of forming at least a hollow region on the substrate comprises defining a plurality of rectangular hollow regions arranged in a matrix on the substrate; and using etching or laser cutting manner to process hollowing treatment on the hollow region.

In one embodiment, the step of forming a semi-hollow region on the framework of the hollow region comprises forming a plurality of through holes arranged uniformly on the framework of the hollow region.

In one embodiment, after the step forming a semi-hollow region on the framework of the hollow region, the step further comprises removing glitches on the substrate such that the edge of the cut or etched substrate become smooth; and providing a frame for mounting the processed substrate thereon to obtain the mask plate.

In order to solve the above problem, another technical solution adopted by the disclosure is to provide a method for packaging an OLED device. The method comprises providing a substrate; forming an OLED device on the substrate; using a first mask plate to form a first passivation layer on the OLED device; wherein the first mask plate comprises: a hollow region; a non-hollow region arranged around the hollow region; and a semi-hollow region in a strip form arranged in the hollow region, having a head portion and a tail portion respectively connecting with the non-hollow region; wherein a thinned region is formed the region on the first passivation layer corresponding to the semi-hollow region; the thickness of the thinned region is smaller than the thickness of the first passivation layer.

In one embodiment, after the step of using a first mask plate to form a first passivation layer on the OLED device, the step further comprises: forming a buffer layer on the first passivation layer; and using a second mask layer on the buffer layer to form a second passivation layer; wherein the second mask plate comprises: a hollow region; a non-hollow region arranged around the hollow region; and a semi-hollow region in a strip form arranged in the hollow region, having a head portion and a tail portion respectively connecting with the non-hollow region; wherein a thinned region is formed the region on the second passivation layer corresponding to the semi-hollow region; the thickness of the thinned region is smaller than the thickness of the second passivation layer.

In one embodiment, the semi-hollow region of the first mask plate and the semi-hollow of the second mask plate are in a staggered arrangement.

In one embodiment, the mask plate comprises a plurality of the semi-hollow regions in a strip form crisscross arranged in the hollow region, and the head portion and the tail portion of each of the hollow regions respectively connect with the non-hollow region.

In one embodiment, the semi-hollow region comprises a plurality of through holes arranged uniformly.

In one embodiment, the OLED device is a flexible device.

The beneficial effects of the disclosure are that, distinguishing from the current technology, the mask plate of the disclosure comprises a hollow region, a non-hollow region arranged around the hollow region, and a semi-hollow region in a strip form arranged in the hollow region, having a head portion and a tail portion respectively connecting with the non-hollow region. The film layer made by the mask plate has a thinned region such that when the entire OLED package structure is bent, the first passivation layer does not have fracture due to the larger stress itself to ensure the resistance to bending of the flexible OLED.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION

Figure 1:
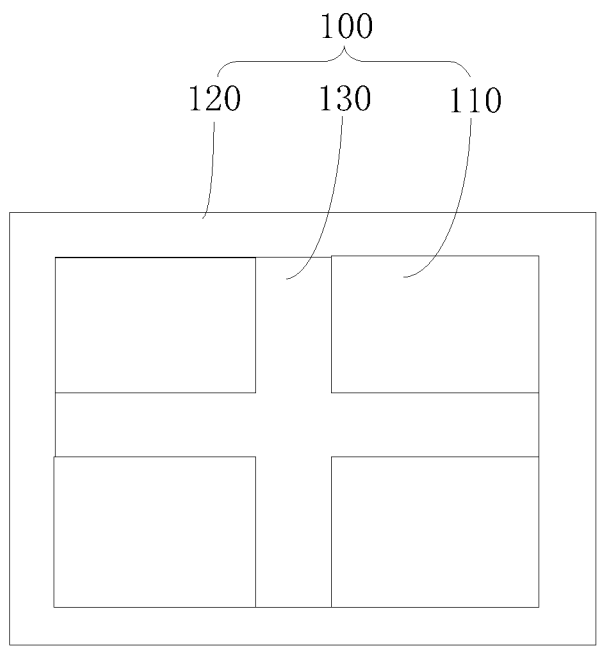
FIG. 1 shows the schematic structure of the first embodiment of the mask plate of the disclosure.

Refer to FIG. 1. FIG. 1 shows the schematic structure of the first embodiment of the mask plate of the disclosure. The mask plate 100 comprises a hollow region 110, a non-hollow region 120 arranged around the hollow region 110, and a semi-hollow region 130 in a strip form arranged in the hollow region 110, having a head portion and a tail portion respectively connecting with the non-hollow region 120. The hollow region 110 adopts laser cutting, photolithography, or etching process to remove a portion to form a hollow shape. During coating, a considerable amount of coating material may pass through the hollow region 110 to form a thicker film layer.

The non-hollow region 120 is the portion not processed. During coating, the coating material does not pass through the non-hollow region 120, and cannot form a film layer.

The semi-hollow region 130 is a region having a partial hollow region and a partial non-hollow region. During coating, small amount of coating material may pass through the semi-hollow region 130 to form a thinner film layer. Simultaneously, the hollow pattern of the semi-hollow region 130 may be arranged according to the requirement. In one embodiment, in order to make the coating being uniform and smooth, the semi-hollow pattern needs to be regular and neat.

The mask plate 100 may be a metal mask plate, such as stainless steel, and may also be made of inorganic materials such as metal oxides, metal sulfides or metal nitrides.

Because the thickness of the film made by using the mask plate 100 is not uniform, a thinner thinned region occurs in the film layer when adopting the mask plate during manufacturing the OLED package. When the flexible OLED is bended, the bending point is at the thinned region, the possibility of the film layer rupture is reduced.

Distinguishing from the current technology, the mask plate of the disclosure comprises a hollow region, a non-hollow region arranged around the hollow region, and a semi-hollow region in a strip form arranged in the hollow region, having a head portion and a tail portion respectively connecting with the non-hollow region. The film layer made by the mask plate has a thinned region such that when the entire OLED package structure is bended, the first passivation layer does not have fracture due to the larger stress itself to ensure the resistance to bending of the flexible OLED.

Figure 2:
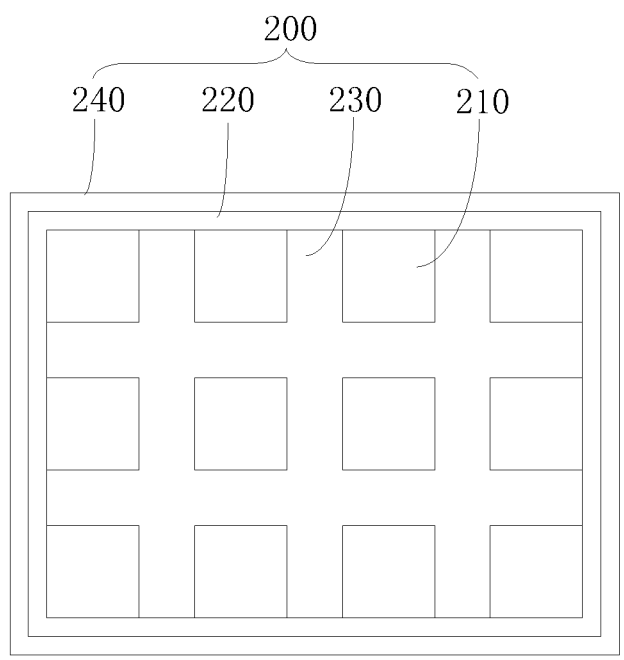
FIG. 2 shows the schematic structure of the second embodiment of the mask plate of the disclosure.

Refer to FIG. 2. The mask plate 200 comprises a hollow region 210, a non-hollow region 220 arranged around the hollow region 210, and a plurality of the semi-hollow regions 230 in a strip form crisscross arranged in the hollow region 210, and the head portion and the tail portion of each of the semi-hollow regions 230 respectively connect with the non-hollow region 220.

Furthermore, a frame 240 may be arranged at the periphery of the non-hollow region 220.

Figure 3:
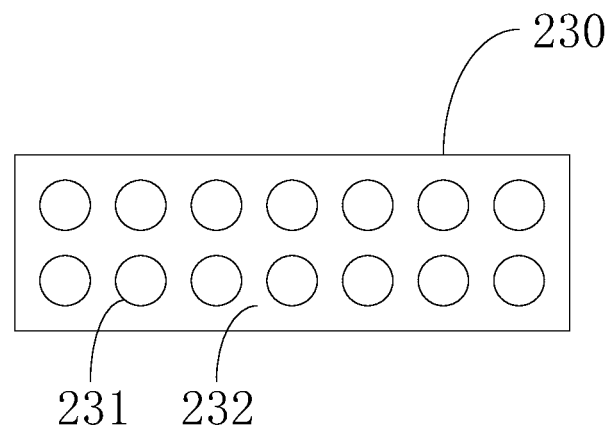
FIG. 3 shows the partial schematic structure of the semi-hollow region in the second embodiment of the mask plate of the disclosure.

As shown in FIG. 3, the semi-hollow region 230 may be a through hole region 231 and a non-through hole region 232. The through hole may be circular, rectangular or other shape. During the coating process, the coating material may only pass through the through hole region 231. All of the coating material may pass through the hollow region 210. Therefore, the thinned region formed in the hollow region 230 is thinner than the normal region formed in the hollow region 240.

Figure 4:
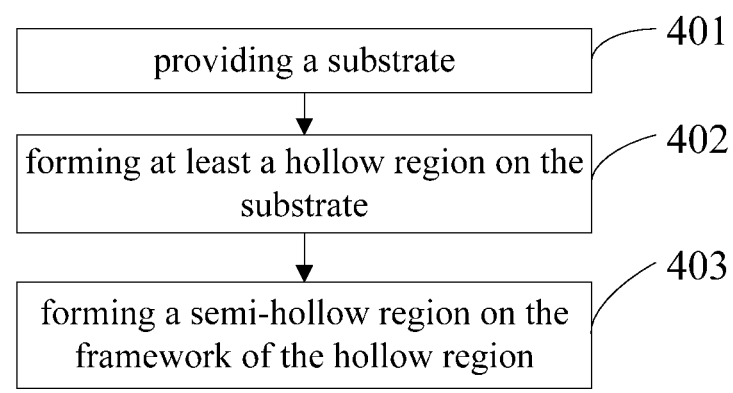
FIG. 4 is the flow chart of the manufacture method of the first embodiment of the mask plate of the disclosure.

Refer to FIG. 4. FIG. 4 is the flow chart of the manufacture method of the first embodiment of the mask plate of the disclosure.

Step 401: providing a substrate;

The substrate may be a metal substrate, and may be metal oxides, metal sulfides or metal nitrides, or glass.

Step 402: forming at least a hollow region on the substrate;

Generally the through holes are formed by laser cutting, photolithography, or etching process.

Step 403: forming a semi-hollow region on the framework of the hollow region.

Figure 5:
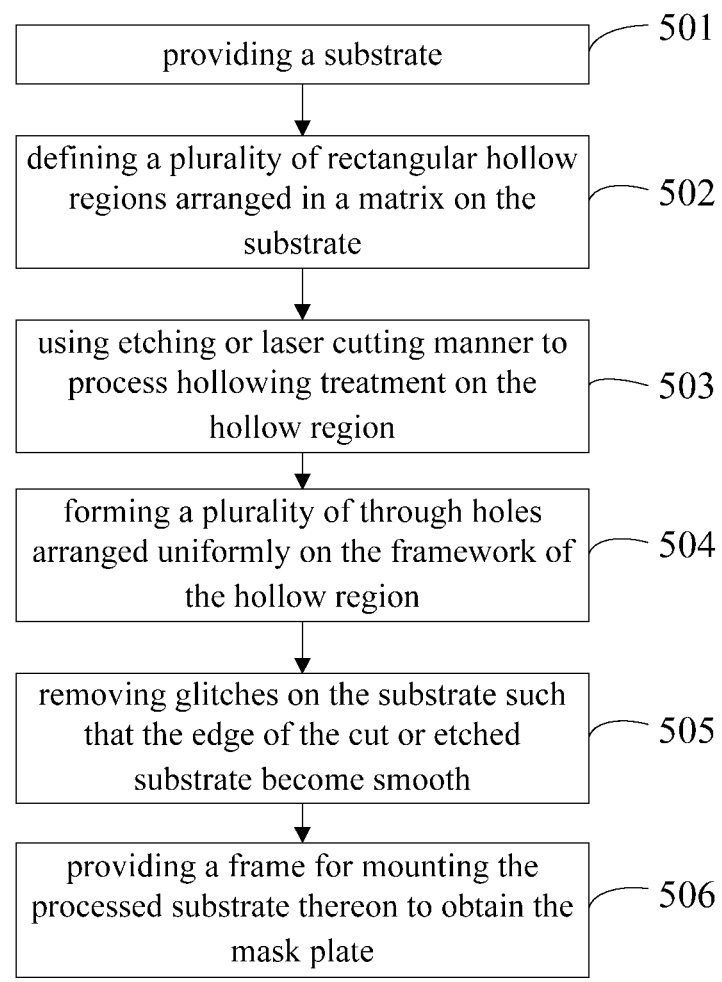
FIG. 5 is the flow chart of the manufacture method of the second embodiment of the mask plate of the disclosure.

Refer to FIG. 5. FIG. 5 is the flow chart of the manufacture method of the second embodiment of the mask plate of the disclosure;

Step 501: providing a substrate;

Step 502: defining a plurality of rectangular hollow regions arranged in a matrix on the substrate;

Step 503: using etching or laser cutting manner to process hollowing treatment on the hollow region.

Figure 6:
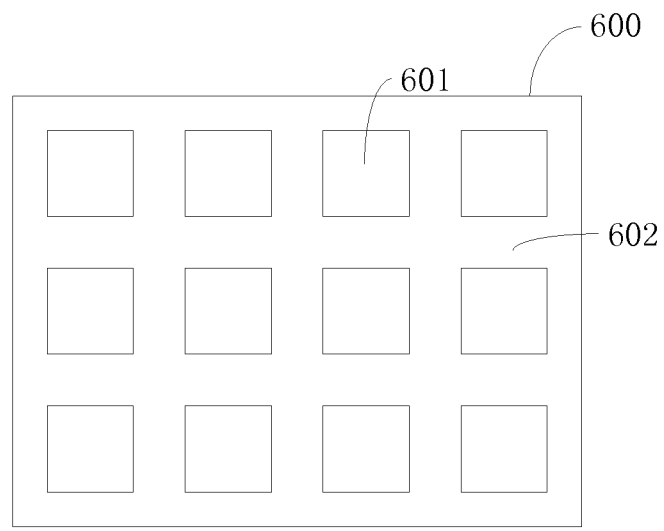
FIG. 6 shows the schematic structure of the framework of the manufacture method of the second embodiment of the mask plate of the disclosure.

As shown in FIG. 6, a plurality of hollow regions 601 is formed on the substrate 600 by suing etching or laser cutting process.

Step 504: forming a plurality of through holes arranged uniformly on the framework of the hollow region;

As shown in FIG. 6, between every two hollow regions 601 is the frame 602. The frame 602 is processed to form the semi-hollow region. It should be noted that the edges of the frame 602 do not require processing to form the through holes, that is to form the non-hollow region.

Step 505: removing glitches on the substrate such that the edge of the cut or etched substrate becomes smooth;

Step 506: providing a frame for mounting the processed substrate thereon to obtain the mask plate.

Figure 7:
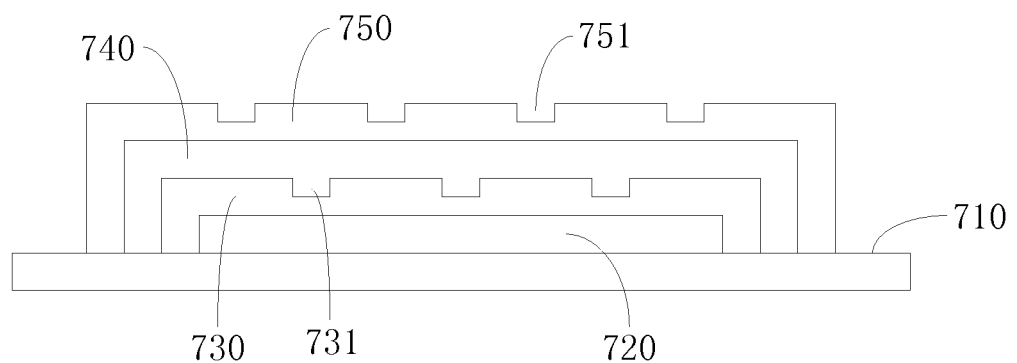
FIG. 7 shows the schematic structure of the OLED package structure using the mask plate of the manufacture method of the second embodiment of the mask plate of the disclosure.

As shown in FIG. 7, during the manufacturing process of OLED package structure, the mask plate is used to form a first passivation layer 730 and a second passivation layer 750 such that these two film layers have thinner thinned regions. The fracture caused by the larger stress of the passivation layer itself when it is bended is well prevented to ensure the resistance to bending of the flexible OLED.

Figure 8:
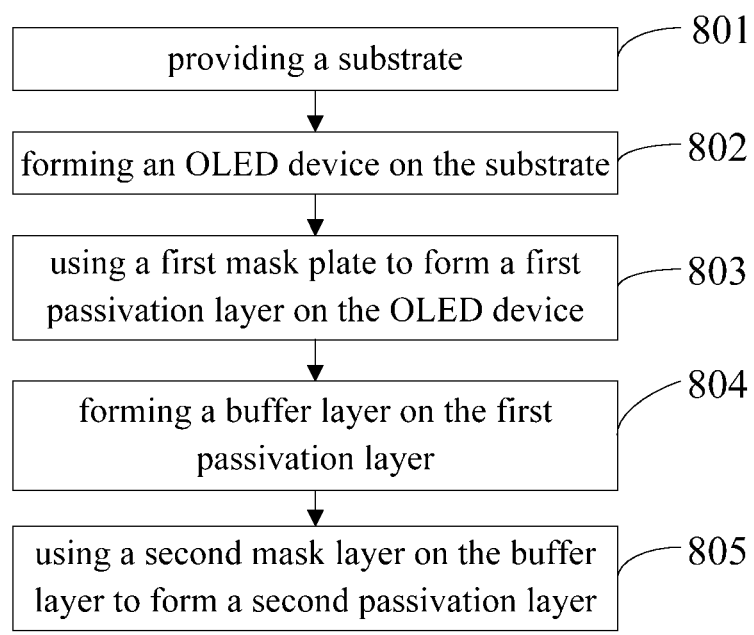
FIG. 8 is the flow chart of one embodiment of the OLED device package method of the disclosure.

Refer to FIG. 8. FIG. 8 is the flow chart of one embodiment of the OLED device package method of the disclosure.

Step 801: providing a substrate;

It is usually a glass substrate. During the process of making flexible OLED panels, a bendable plastic substrate may be also adopted.

Step 802: forming an OLED device on the substrate;

The OLED device comprises an organic film, wherein the organic film is enclosed between the cathode and the anode metal. The organic film illuminates when the two electrodes are applied with a voltage.

Step 8032: using a first mask plate to form a first passivation layer on the OLED device;

The first mask plate is the mask plate as mentioned in the previous embodiments.

The first mask is usually made of inorganic material, such as metal oxides, metal sulfides or metal nitrides. The metal oxide comprises calcium oxide, tantalum pentoxide, titanium dioxide, zirconium dioxide, copper oxide, zinc oxide, aluminum oxide, chromium oxide, tin oxide, nickel oxide, antimony pentoxide; metal sulfides include titanium disulfide, iron sulfide, chromium trisulphide, copper sulfide, zinc sulfide, tin sulfide, nickel sulfide, cobalt trisulfide, antimony trisulfide, lead sulfide, trisulfide lanthanum, cerium sulfide, disulfide zirconivand and so on. The metal nitride comprises silicon nitride, aluminum nitride and so on.

Step 804: forming a buffer layer on the first passivation layer;

The buffer layer usually adopts organic material, such aspolyethylene terephthalate (PET), polyethylene terephthalate polyethylene naphthalate (PEN), polycarbonate (PC), polyimide (PI), polyvinyl chloride (PVC), polystyrene (PS), polymethyl methacrylate (PMMA), poly (butylene terephthalate) (PBT), polysulfone (PSO), polyethylene terephthalate ethyl sulfone (PES), polyethylene (PE), polypropylene (PP), silicone (Silicone), polyamide (PA), polyvinylidene fluoride (PVDF), ethylene-vinyl acetate copolymer (EVA), ethylene-vinyl alcohol copolymer (EVAL), poly acrylonitrile (PAN), polyvinyl acetate (PVAC), parylene, polyurea or polytetrafluoroethylene (PTFE), or epoxy resin.

Step 805: using a second mask layer on the buffer layer to form a second passivation layer;

The second mask plate is the mask plate as mentioned in the previous embodiments.

It should be noted that to sure the thinned regions of the first passivation layer and the second passivation layer to be in a staggered arrangement, the semi-hollow region of the first mask plate and the semi-hollow region of the second mask plate should also be in a staggered arrangement.

Although the present disclosure is illustrated and described with reference to specific embodiments, those skilled in the art will understand that many variations and modifications are readily attainable without departing from the spirit and scope thereof as defined by the appended claims and their legal equivalents.

What is claimed is:

1. A mask plate, comprising:
a hollow region;
a non-hollow region arranged around the hollow region; and
a semi-hollow region in a strip form arranged in the hollow region, having a head portion and a tail portion respectively connecting with the non-hollow region, wherein a thickness of a passivation layer formed by the hollow region is larger than the thickness of the passivation layer formed by the semi-hollow region.

2. The mask plate according to claim 1, wherein the mask plate comprises a plurality of the semi-hollow regions in a strip form crisscross arranged in the hollow region, and the head portion and the tail portion of each of the semi-hollow regions respectively connect with the non-hollow region.

3. The mask plate according to claim 1, wherein the semi-hollow region comprises a plurality of through holes arranged uniformly.

4. The mask plate according to claim 3, wherein the through holes are formed by laser cutting, photolithography, or etching process.

5. The mask plate according to claim 1, wherein the mask plate is made of a metal material or metal oxide material.

6. A method for manufacturing a mask plate, comprising:
providing a substrate;
forming at least a hollow region on the substrate; and
forming a semi-hollow region on the framework of the hollow region, wherein a thickness of a passivation layer formed by the hollow region is larger than the thickness of the passivation layer formed by the semi-hollow region.

7. The method according to claim 6, wherein the step of forming at least a hollow region on the substrate comprises:
defining a plurality of rectangular hollow regions arranged in a matrix on the substrate; and
using etching or laser cutting manner to process hollowing treatment on the hollow region.

8. The method according to claim 6, wherein the step of forming a semi-hollow region on the framework of the hollow region comprises:
forming a plurality of through holes arranged uniformly on the framework of the hollow region.

9. The method according to claim 6, wherein after the step forming a semi-hollow region on the framework of the hollow region, the step further comprises:
removing glitches on the substrate such that the edge of the cut or etched substrate become smooth; and
providing a frame for mounting the processed substrate thereon to obtain the mask plate.

10. A method for packaging an OLED device, comprising:
providing a substrate;
forming an OLED device on the substrate;
using a first mask plate to form a first passivation layer on the OLED device;
wherein the first mask plate comprises:
a hollow region;
a non-hollow region arranged around the hollow region; and
a semi-hollow region in a strip form arranged in the hollow region, having a head portion and a tail portion respectively connecting with the non-hollow region; wherein a thickness of the first passivation layer formed by the hollow region is larger than the thickness of the first passivation layer formed by the semi-hollow region.

11. The method according to claim 10, wherein after the step of using a first mask plate to form a first passivation layer on the OLED device, the step further comprises:
forming a buffer layer on the first passivation layer; and
using a second mask layer on the buffer layer to form a second passivation layer;
wherein the second mask plate comprises:
a hollow region;
a non-hollow region arranged around the hollow region; and
a semi-hollow region in a strip form arranged in the hollow region, having a head portion and a tail portion respectively connecting with the non-hollow region; wherein a thickness of the second passivation layer formed by the hollow region is larger than the thickness of the second passivation layer formed by the semi-hollow region.

12. The method according to claim 11, wherein the semi-hollow region of the first mask plate and the semi-hollow of the second mask plate are in a staggered arrangement.

13. The method according to claim 10, wherein the mask plate comprises a plurality of the semi-hollow regions in a strip form crisscross arranged in the hollow region, and the head portion and the tail portion of each of the hollow regions respectively connect with the non-hollow region.

14. The method according to claim 10, wherein semi-hollow region comprises a plurality of through holes arranged uniformly.

15. The method according to claim 10, wherein the OLED device is a flexible device.

* * * * *